(12) United States Patent
Naeem et al.

(10) Patent No.: US 6,555,204 B1
(45) Date of Patent: Apr. 29, 2003

(54) METHOD OF PREVENTING BRIDGING BETWEEN POLYCRYSTALLINE MICRO-SCALE FEATURES

(75) Inventors: Munir D. Naeem, Poughkeepsie; Lawrence A. Clevenger, Lagrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,095

(22) Filed: Mar. 14, 2000

(51) Int. Cl.[7] ................................. B32B 5/00
(52) U.S. Cl. ................. 428/192; 428/209; 428/216; 438/643; 438/653; 438/680; 438/688
(58) Field of Search ................. 428/209, 216, 428/669, 192; 438/688, 680, 643, 653

(56) References Cited

U.S. PATENT DOCUMENTS

| | | | |
|---|---|---|---|
| 5,441,915 A | * 8/1995 | Lee | 437/195 |
| 5,712,509 A | 1/1998 | Harada et al. | 257/758 |
| 5,943,601 A | * 8/1999 | Usui et al. | 438/688 |

* cited by examiner

Primary Examiner—Deborah Jones
Assistant Examiner—Andrew T Piziali

(74) Attorney, Agent, or Firm—Marian Underwieser; Gary M. Hartman; Domenica N.S. Hartman

(57) ABSTRACT

A method of preventing or at least reducing the likelihood of bridging between adjacent micro-scale polycrystalline structures, and particularly to reducing electrical shorting between adjacent metallization lines of a microcircuit. The method generally entails forming a multilayer structure that comprises a polycrystalline layer and at least one constraining layer, and then patterning the multilayer structure to yield a first line and a second line that is narrower in width than the first line. The first line has a patterned edge that is spaced apart from a patterned edge of the second line, so that the first and second lines are electrically insulated from each other. One or more features associated with the first line are then formed that prevent bridging between the first and second lines if excessive lateral grain growth subsequently occurs along the patterned edge of the first line. Suitable features include patterning the multilayer structure to form a dummy line between and spaced apart from the first and second lines, patterning holes near the patterned edge of the first line, forming the patterned edge of the first line to have teeth that project toward the second line and are closer to the second line than the remainder of the patterned edge between the teeth, and forming the patterned edge of the first line to be stepped so that the first line has corner regions at opposite ends of the patterned edge that are closer to the second line than the remainder of the patterned edge between the corner regions. The invention also encompasses multilayer structures formed in accordance with the method.

38 Claims, 5 Drawing Sheets

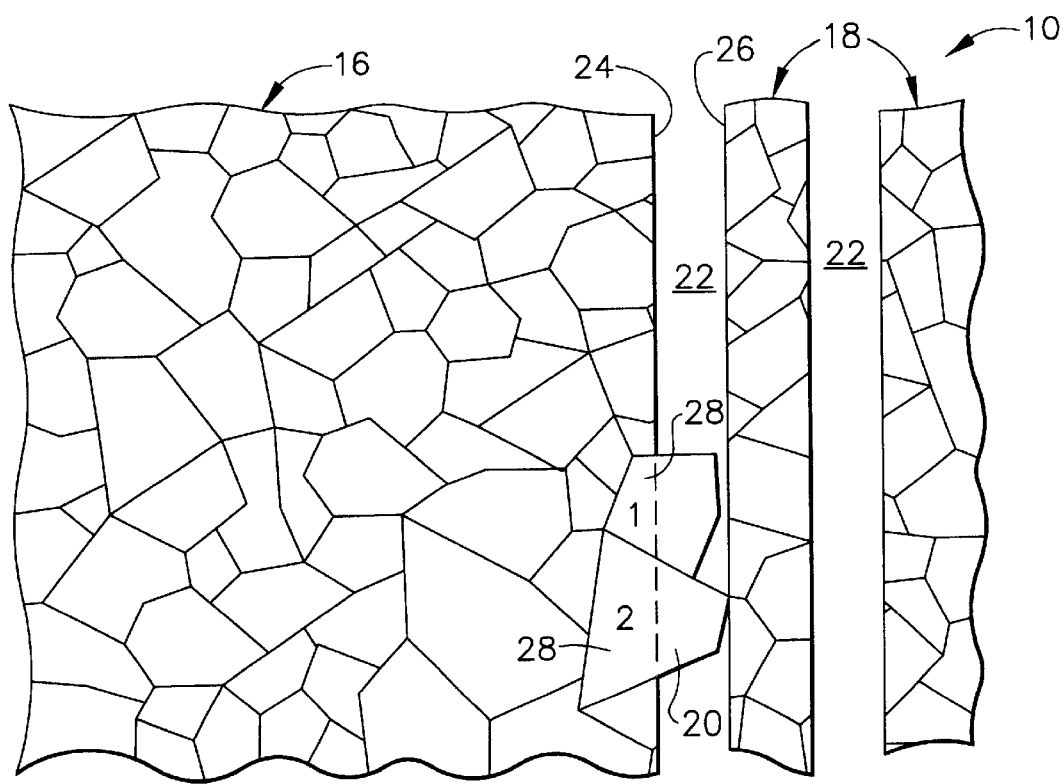
FIG. 5  *PRIOR ART*
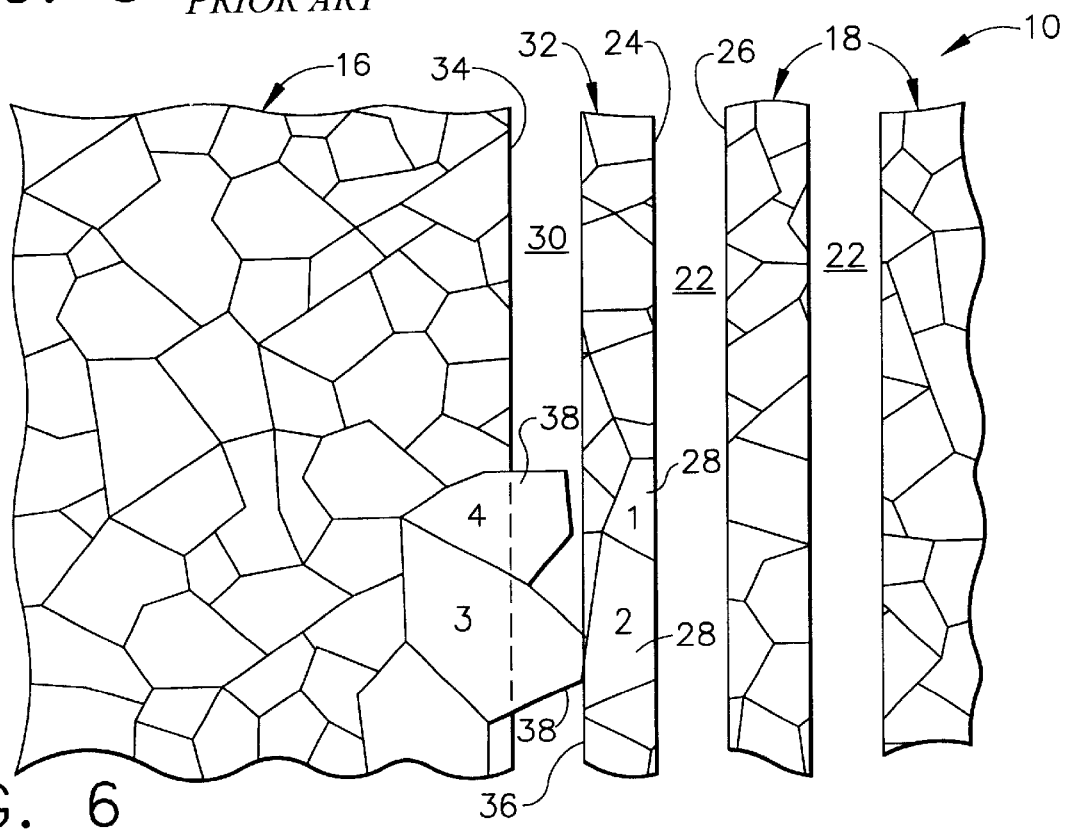
FIG. 6

METHOD OF PREVENTING BRIDGING BETWEEN POLYCRYSTALLINE MICRO-SCALE FEATURES

BACKGROUND OF THE INVENTION

1. Field of the Invention

The present invention generally relates to micro-scale features formed of polycrystalline materials, such as metallizations for microelectronic applications. More particularly, this invention relates to a method of forming metal lines so that lateral grain growth that occurs during extended heating does not cause bridging and electrical shorting.

2. Description of the Prior Art

As represented in FIG. 1, backend of the line (BEOL) interconnect metallization 10 often includes an electrically-conductive layer 12 of a polycrystalline aluminum-copper alloy that is sandwiched between a pair of diffusion barrier layers 14. The diffusion barrier layers 14 reduce the solid state diffusion rate between the conductive layer 12 and metals from surrounding metal structures, so as to improve the reliability and sheet resistance of the metallization 10. However, it has been determined that, if the metallization 10 is heated for a sufficient period, as during annealing or other subsequent thermal processing, stresses occur within the metallization 10 as a result of the barrier layers 14 constraining the thermal expansion of the conductive layer 12. Under certain conditions, these stresses can induce grain growth in the conductive layer 12 parallel to the plane of the conductive layer 12 (hereinafter termed lateral grain growth), especially if the metallization 10 is sufficiently thin (e.g., 0.25 micrometer or less), which can result in metal shorting between adjacent metallization structures. As an example, FIG. 2 represents a metal pad 16 in which lateral grain growth (i.e., grain growth in the plane of the metal pad 16) has occurred to create a metal bridge 20 that protrudes from the metal pad 16 and contacts an adjacent metal line 18. The likelihood of the metal shorting represented in FIG. 2 can be a significant yield and reliability issue for the metallization 10. While greater spacing between the metal pad 16 and line 18 would avoid metal shorting, such an option may not be feasible or practical in view of the demand for greater miniaturization of microcircuits, termed "design shrink" in the electronics industry.

Accordingly, it would be desirable to provide a method for inhibiting or preventing bridging between fine metallization features without necessitating greater feature spacing.

SUMMARY OF THE INVENTION

The present invention provides a method of preventing or at least significantly reducing the likelihood of bridging between adjacent polycrystalline materials, and particularly to reducing electrical shorting between adjacent metallizations of a microcircuit. The invention also encompasses metallizations formed in accordance with the method. A key aspect of the invention is the determination of the mechanism by which grain growth is more likely to occur, namely, the growth of metal grains that have been sectioned by patterning to have fewer than six grain boundaries, the most thermodynamically stable condition. If constrained, as is the case with a conductive layer between a pair of diffusion barrier layers, excessive grain growth is most likely to occur in grains with fewer than six boundaries, and is predominantly lateral (two-dimensional). It has also been determined that grain growth of this type is favored by wider metallization features, such as metal pads as compared to thin metal lines (as used herein, the former includes relatively wide metal lines). By inhibiting or blocking lateral grain growth from metallization features more susceptible to such growth, the incidence of metal bridging between the features is significantly reduced or even eliminated.

The method of this invention generally entails forming a metal layer on a substrate, which is then patterned to yield at least two metal structures. A first of the metal structures has a patterned edge that is spaced apart from a patterned edge of the second metal structure, so that the first and second metal structures are electrically insulated from each other. However, as explained above, certain thermal treatments can lead to lateral grain growth along that patterned edge of the first metal structure which, if the first and second metal structures are sufficiently close and the grain growth is excessive, will create a metal bridge between the metal structures. Therefore, the present invention further provides metallization features that will prevent electrical shorting between the first and second metal structures if excessive lateral grain growth were to subsequently occur along the patterned edge of the first metal structure. Metallization features contemplated by this invention include patterning the metal layer to form a dummy metal line between and spaced apart from the first and second metal structures, patterning holes near the patterned edge of the first metal structure, forming the patterned edge of the first metal structure to have teeth that project toward the second metal structure, and forming the patterned edge of the first metal structure to be stepped so that the first metal structure has corners at opposite ends of the patterned edge that are closer to the second metal structure than the remainder of the patterned edge.

According to the present invention, the presence of a dummy metal line between the first and second metal structures permits lateral grain growth from the first metal structure to occur without any detrimental effect, since any metal bridge that might occur between the first metal structure and dummy line does not create an electrical short because the dummy metal line is not electrically connected to any electrical component of the microcircuit. Importantly, and according to the invention, there is not a significant concern for metal bridging between the dummy line and second metal structure caused by lateral grain growth of the dummy and/or second metal structure as compared to metal bridging caused by lateral grain growth from the larger first metal structure. The remaining bridge-inhibiting metallization features of this invention—the patterned holes, teeth, and steps formed along the patterned edge of the first metal structure—serve to accommodate inward grain growth from the patterned edge of the first metal structure, as opposed to outward grain growth toward the adjacent second metal structure. The effect of each approach contemplated by the present invention is the reduction or elimination of metal bridging between closely adjacent metallization features, even where lateral grain grown has occurred.

Other objects and advantages of this invention will be better appreciated from the following detailed description.

BRIEF DESCRIPTION OF THE DRAWINGS

FIGS. 3 through 6 show metallization process steps, with FIG. 5 being representative of metal bridging that occurs in accordance with the prior art, and FIG. 6 showing the use of a dummy metal line that prevents metal bridging in accordance with the present invention.

DETAILED DESCRIPTION OF THE PREFERRED EMBODIMENT

Figure 1:
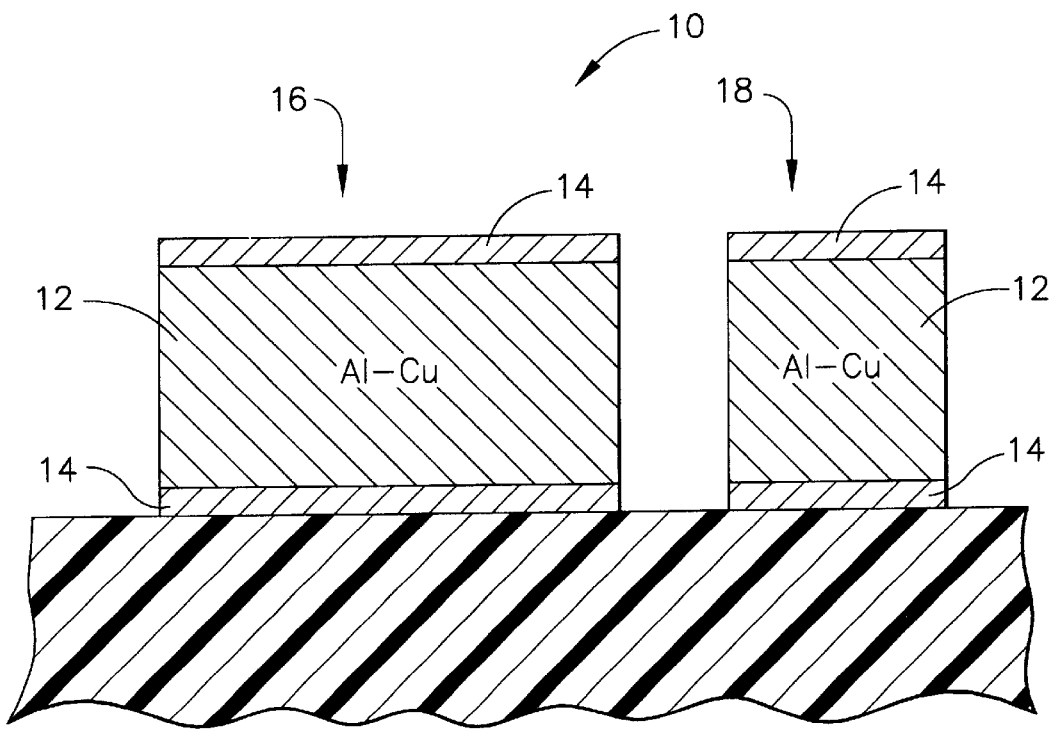
FIGS. 1 and 2 represent a metal pad and line of the prior art in which metal bridging occurs as a result of lateral growth from the metal pad.
Figure 3:
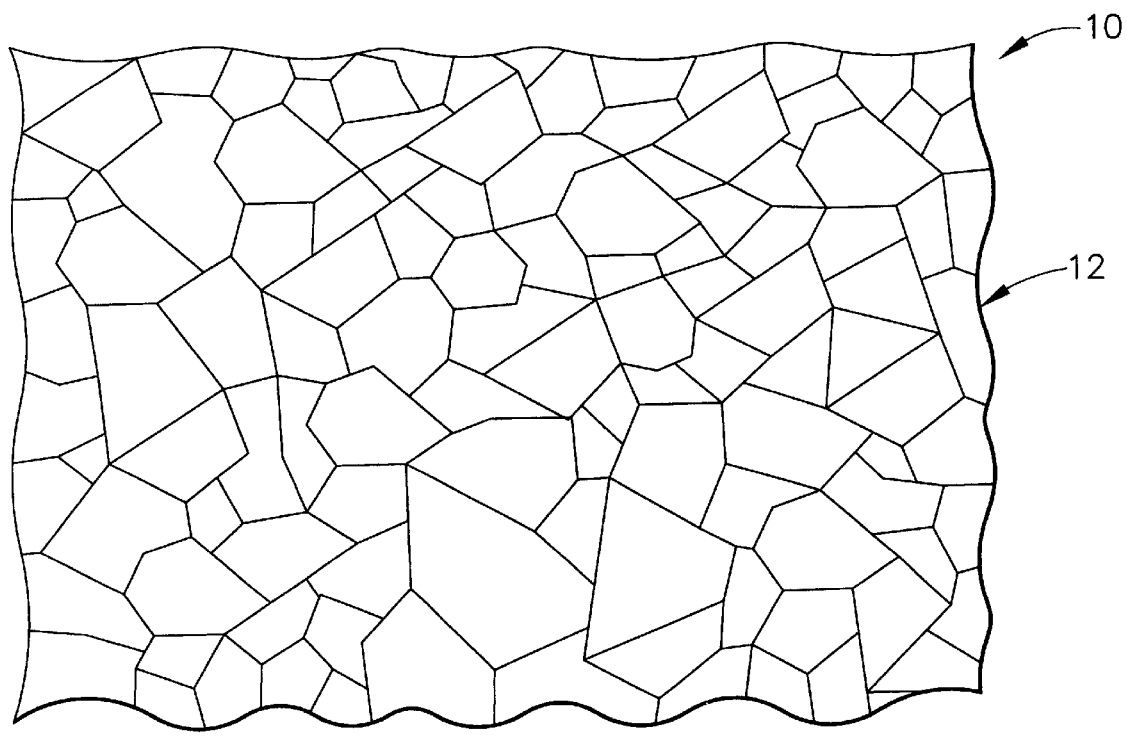

FIG. 3 represents a plan view of the metallization 10 shown in FIG. 1, with the top diffusion layer 14 omitted to reveal the underlying polycrystalline conductive layer 12. As is known in the art, diffusion barrier layers 14 of materials such as titanium, titanium nitride and combinations of both, serve to reduce the solid state diffusion rate between the conductive layer 12 and metals from surrounding metal structures. The thickness of the metallization 10 can vary, with thicknesses of about 0.25 μm and less being typical for certain applications. As will become apparent, metallization thickness is a particularly important parameter from the standpoint of realizing the benefits of this invention. While Al—Cu alloys are preferred for the conductive layer 12, and titanium and titanium nitride are preferred materials for the barrier layers 14, other materials could foreseeably be used to form the metallization 10. In addition, one of the diffusion layers 14 could be omitted, and additional metal layers could be encapsulated between the diffusion layers 14.

Figure 2:
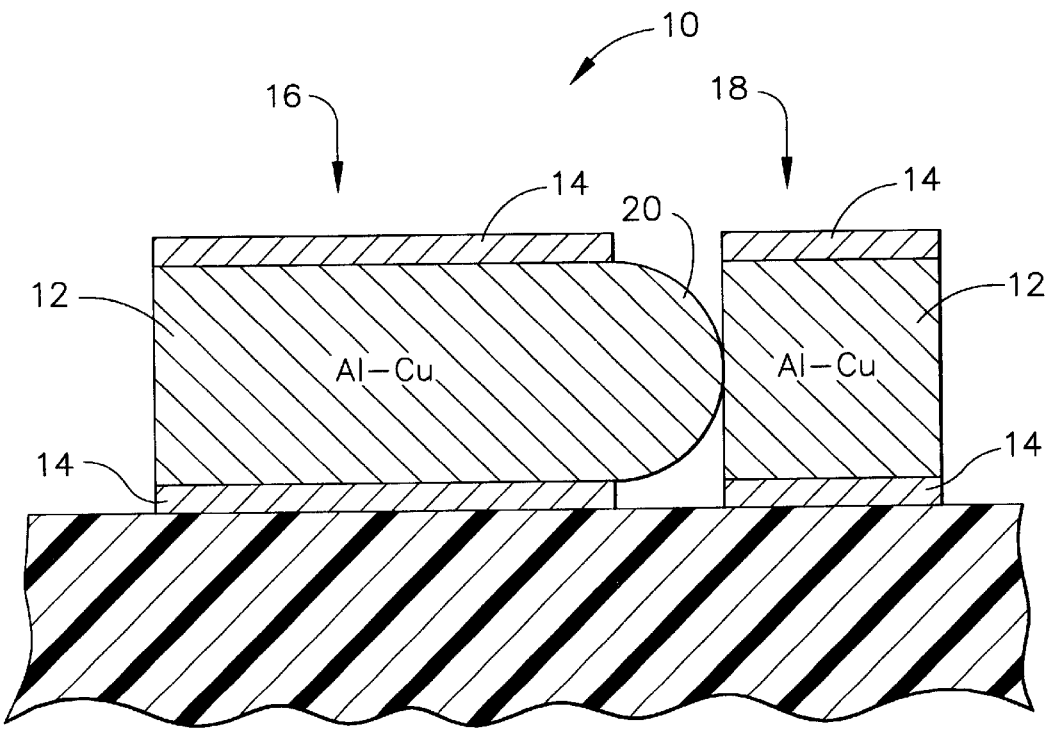

As previously explained with reference to FIG. 2, lateral grain growth has been found to occur with polycrystalline metallizations formed by prior art metallization processes in which the metallization 10 is patterned to form a fine metal line 18 and a relatively larger metal structure, referred to herein as a pad 16. The grain boundaries of the conductive layer 12 are represented in FIGS. 3 through 6 to help illustrate the mechanism determined to be active in causing lateral grain growth (i.e., two-dimensional grain growth in the plane of the conductive layer 12) from the metal pad 16 toward the metal line 18 of FIG. 2. FIG. 3 represents the typical grain structure of an Al—Cu alloy conductive layer 12 after deposition. The grain structure and texture of the Al—Cu conductive layer 12 will depend on many factors, including deposition conditions and the type of substrate and barrier materials used. In one example, the average grain size of the Al—Cu conductive layer 12 may be on the order of about 0.005 to about 2 μm if deposited by electroplating, sputtering, evaporation, chemical or physical vapor deposition, etc.

Figure 4:
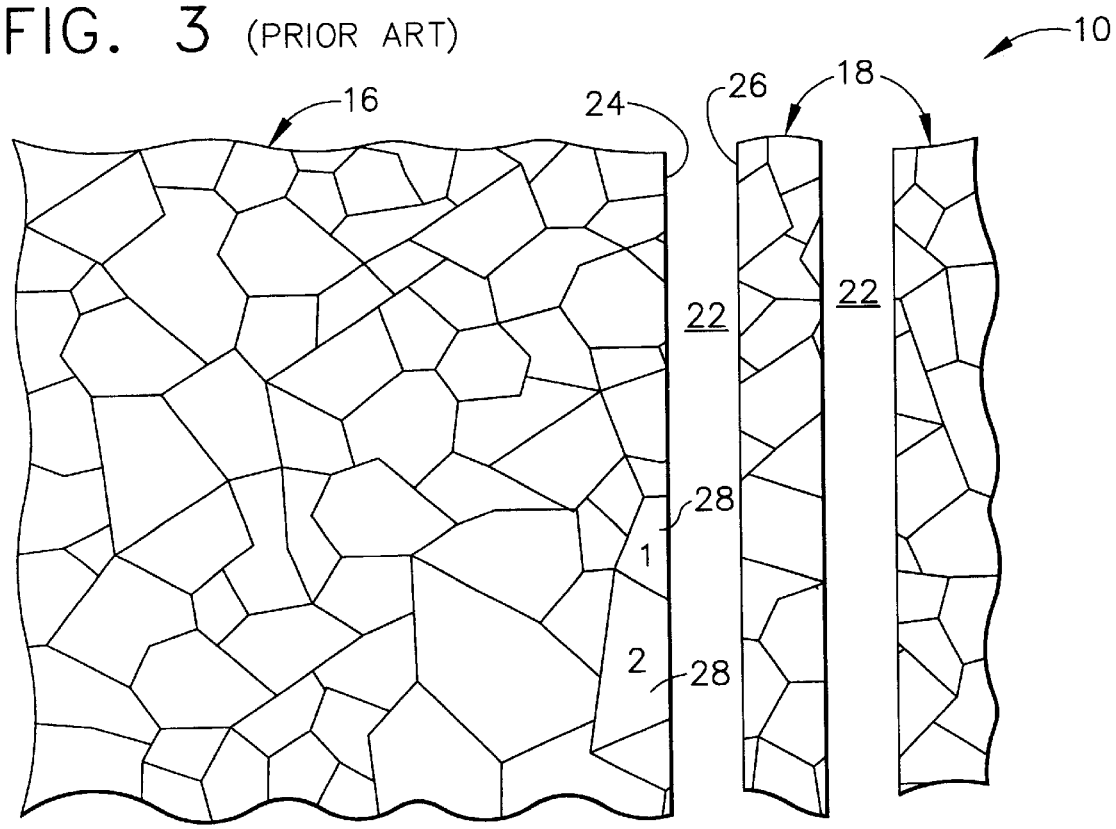

In FIG. 4, the metallization 10 is shown as having been patterned by such known methods as lithography and metal reactive ion etching (RIE), by which the metal pad 16 and two metal lines 18 have been delineated by trenches 22 in the metallization 10. The trenches 22 delineate opposing edges 24 and 26 of the metal pad 16 and the nearest metal line 18, respectively. The spacing between these edges 24 and 26 is shown as being approximately equal to or less than the average grain size in the conductive layer 12 (e.g., about 0.9 μm). The grains at the edges 24 and 26 of the metal pad 16 and metal lines 18 are shown as being sectioned by the trenches 22. Two grains 28 along the edge 24 of the pad 16 are singled out in FIG. 4 for purposes of the following discussion. FIG. 5 represents the effect of the metallization 10 having been heated, such as annealed, during which lateral grain growth of the grains 28 has occurred, with one of these grains 28 forming a metal bridge 20 with the edge 26 of the adjacent line 18.

According to this invention, the metal bridge 20 is the result of stress conditions in the Al—Cu conductive layer 12 during a thermal cycle. As a result of having a higher coefficient of thermal expansion, the Al—Cu conductive layer 12 is physically constrained by the barrier layers 14. As a result of the patterning process, grains along the patterned edge 24 of the metal pad 16 are left with grain boundaries greater or fewer than six. The grains 28 are shown in FIG. 4 as having fewer than six grain boundaries. According to this invention, grains with fewer than six grain boundaries are prone to lateral (two-dimensional) grain growth as a result of the conductive layer 12 being constrained by the diffusion barrier layers 14. Modeling such as Mullins-Von Neumann can be used to predict the grain growth under such conditions. Based on two-dimensional grain growth modeling, when the metal pad 16 is sufficiently heated, e.g., to a temperature of 200° C. to 300° C. for the Al—Cu conductive layer 12, grains with six grain boundaries are least likely to undergo grain growth, grains with more than six grain boundaries are likely to shrink, and grains with less than six grain boundaries (e.g., grains 28 in FIGS. 4 and 5) are likely to grow. Significantly, grain growth is not likely to initiate in the narrower lines 18, as shown in FIG. 5. While not wishing to be held to any particular theory, two explanations are offered. According to the first, a significant driving force is not present for grain growth in the thinner lines 18 because of the relatively straight grain boundaries produced by metal RIE between adjacent grains in the lines 18, yielding what is termed here a "bamboo" grain structure. The second proposed explanation is that two-dimensional grain growth models do not hold, and grain growth must be volumetric that follows the limitation of height-to-area rule of grain growth. Whatever the cause, there is more significant force on the grains 28 of the conductive layer 12 at the patterned edge 24, and these grains 28 follow the two-dimensional grain growth model due to the presence of the barrier layers 14. The combination of stress and the grain boundary instabilities of the grains 28 lead to grain growth later during annealing or another high temperature excursion. The grain growth depicted for the grains 28 in FIG. 5 has been seen in actual hardware, with metal shorts resulting if the distance between the metal pad and its adjacent metal line is less than or equal to the average grain size of the grains of the metal pad.

A first solution provided by this invention to solve this problem is illustrated in FIG. 6, in which an additional trench 30 has been formed in the metal pad 16, delineating a "dummy" metal line 32 that is not electrically connected to any circuit device. The metal pad 16 has a patterned edge 34 that faces an adjacent edge 36 of the dummy line 32. The widths of the dummy line 32 and trench 30 are shown as being less than or equal to the average grain size of the conductive layer 12. FIG. 6 represents the appearance of the conductive layer 12 following annealing of the metallization 10, during which two grains 38 of the metal pad 16 grew laterally into contact with the dummy line 32. According to the explanation provided above, the grains 38 are shown as having grown because they were unstable as a result of having fewer than six grain boundaries prior to annealing. The larger of the grains 38 contacts the dummy line 32, but with no detrimental effect since the dummy line 32 is not connected to any circuit device. On the other hand, the additional trench 30 has resulted in the larger of the grains 28—originally unstable and prone to grain growth in FIG. 5—being stabilized as a result of the edge 36 of the dummy line 32 producing a sixth grain boundary. As a result, the larger grain 28 has not grown during the thermal treatment, and therefore the metal bridge 20 shown in FIG. 5 has not occurred in FIG. 6.

Figure 7:
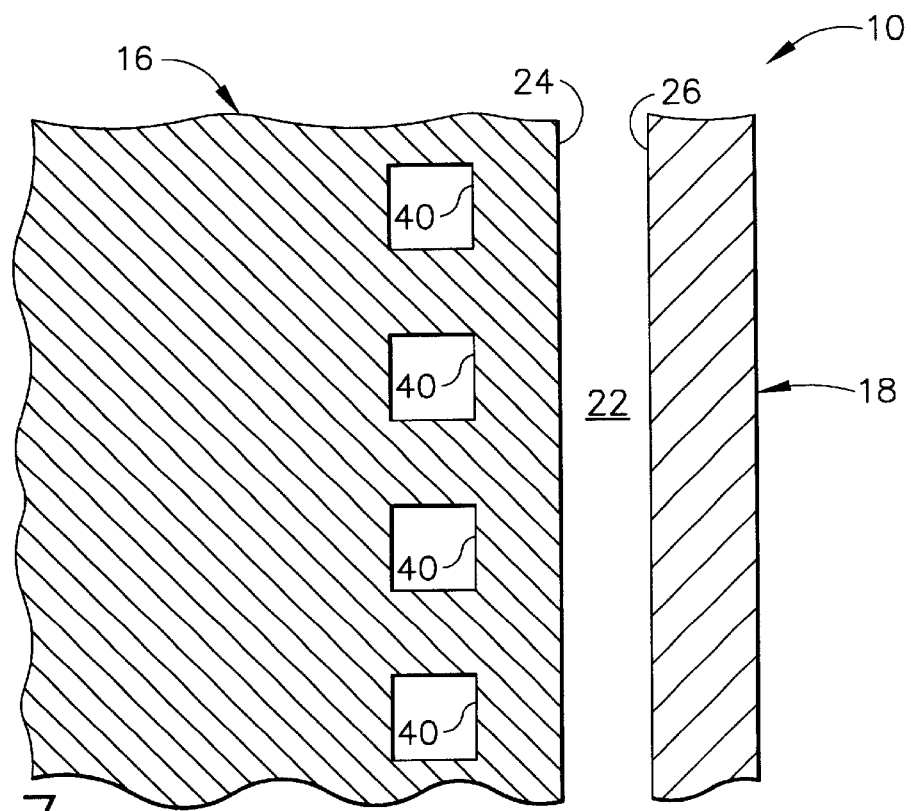
FIGS. 7 through 10 represent alternative methods and embodiments for inhibiting metal bridging between a metal pad and a metal line in accordance with of this invention.

FIGS. 7 through 10 illustrate other embodiments for preventing or at least inhibiting metal bridging in accordance with the teachings of this invention. In FIG. 7, a row of holes 40 has been etched or otherwise formed near the patterned edge 24 of the metal pad 16. The holes 40 are sized and located so that grains surrounding the holes 40 will not extrude into the trench 22 between the metal pad 16 and its adjacent metal line 18, but instead will grow into the holes 40. To be effective, the distance between adjacent holes 40 and between the holes 40 and the edge 24 of the metal pad 16 must be approximately equal to or less than the average grain size of the conductive layer 12. The shape of the holes 40 is not critical, and therefore could differ from that shown in the Figures.

Figure 8:
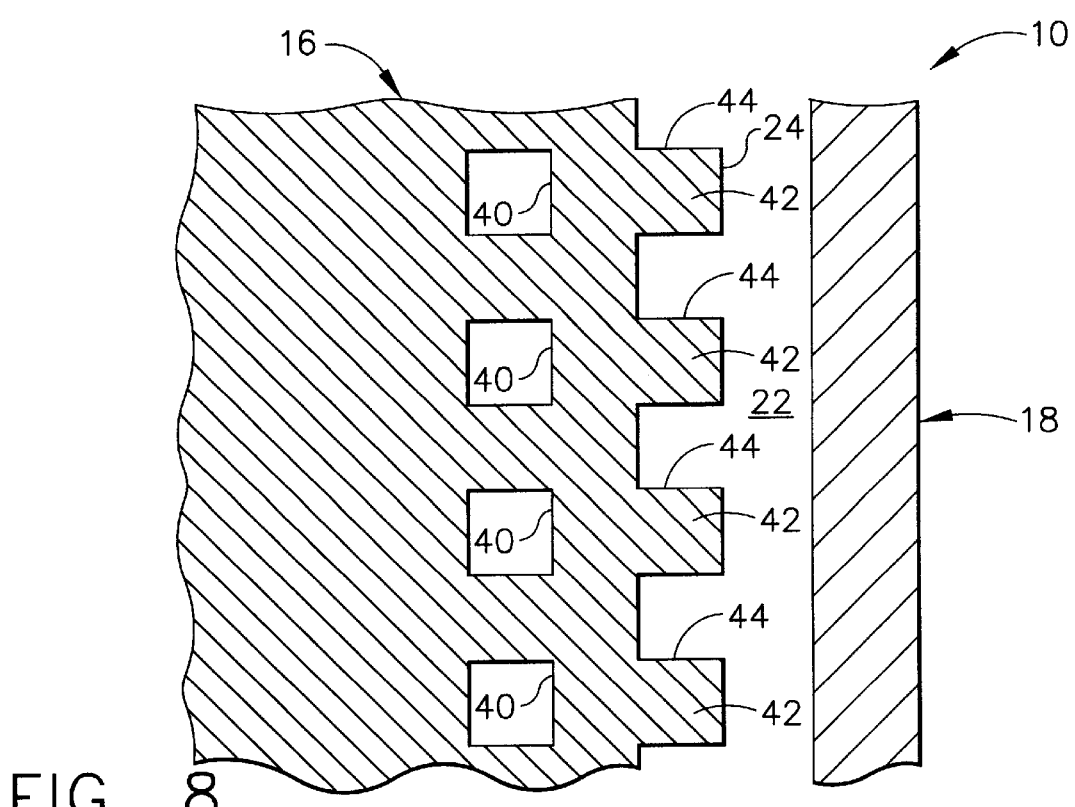
Figure 9:
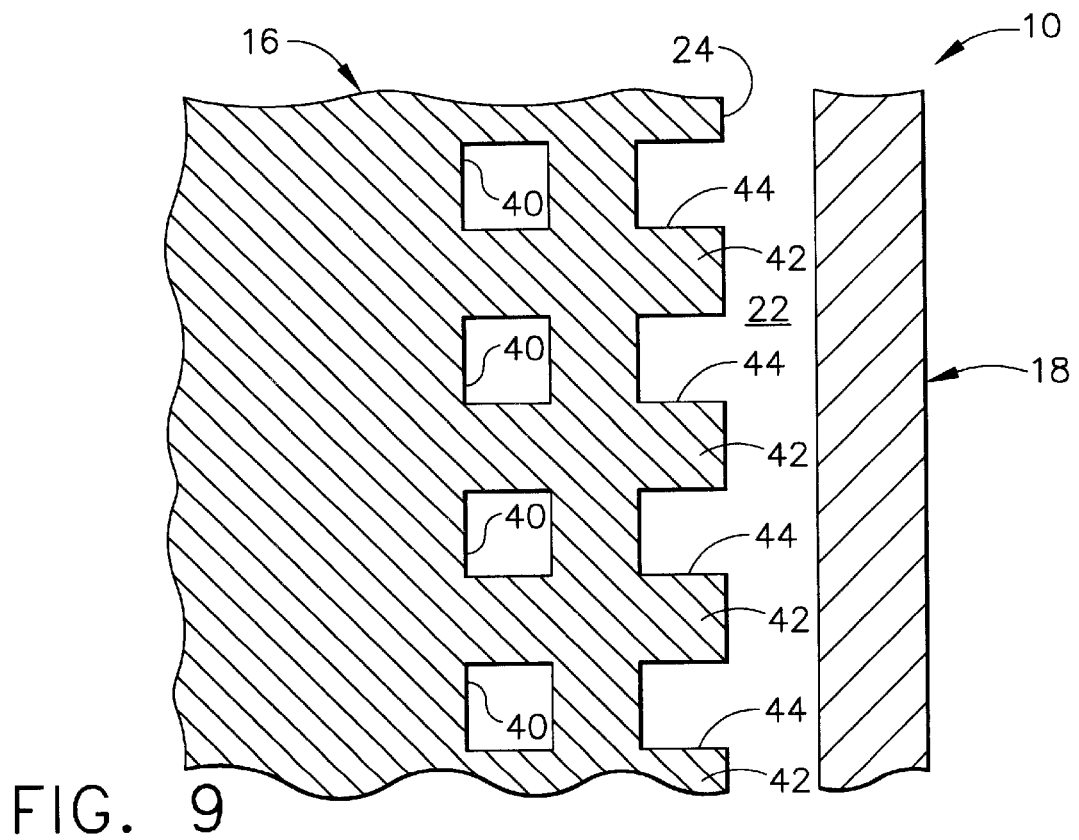

In FIGS. 8 and 9, a row of square-shaped teeth 42 have been provided in addition to the row of holes 40 shown in FIG. 7. In FIG. 8, each hole 40 is directly inboard from a tooth 42, while in FIG. 9 each hole 40 is directly inboard from one of the gaps 44 between the teeth 42. In each of these embodiments, the size of each hole 40, tooth 42 and gap 44 and the distance between each hole 40 and its nearest edge 24 or gap 44 is approximately equal to or less than the average grain size of the conductive layer 12. In accordance with this invention, the conductive layer 12 within each tooth 42 does not extrude or grow laterally into the line 18 because of the bamboo grain structure within each tooth 42 as a result of the size/width of the teeth 42, for the reason discussed above in reference to the metal and dummy lines 18 and 32 of FIG. 6. Furthermore, any lateral grain growth that might occur within the gaps 44 will not result in a metal bridge as a result of the greater width of the trench 22 at each gap 44.

Figure 10:
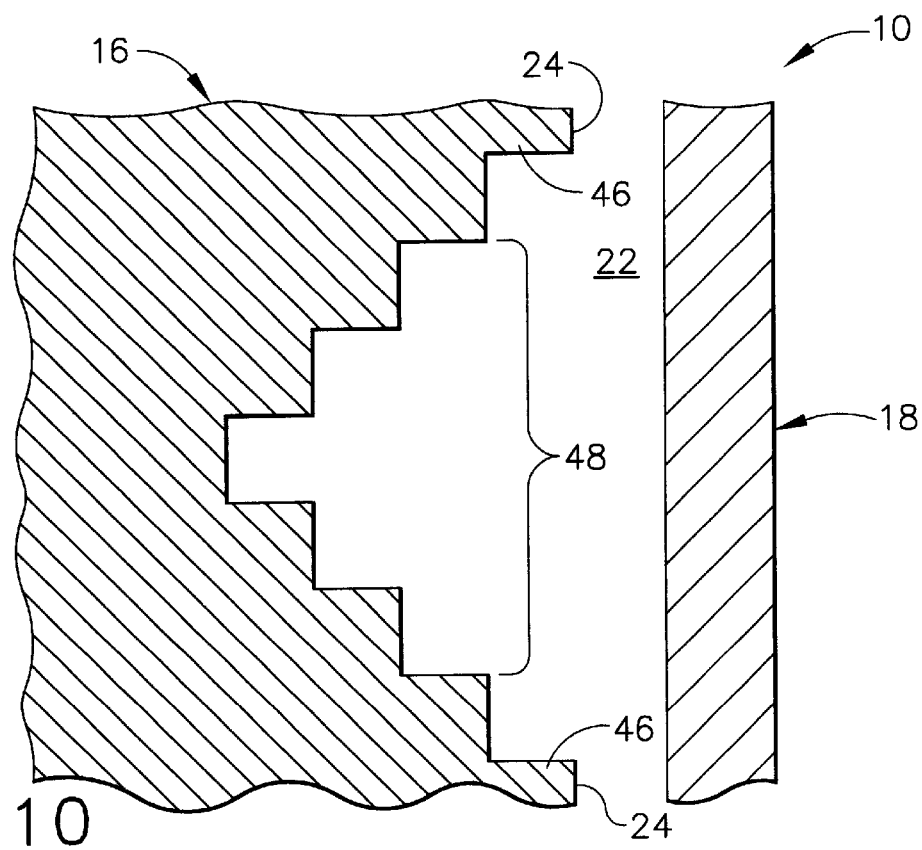

Finally, FIG. 10 shows the patterned edge 24 of the metal pad 16 being etched or otherwise formed to have a stepped profile, with corners 46 of the metal pad 16 at opposite ends of the edge 24 being closer to the adjacent metal line 18 than the remaining interior region 48 of the edge 24. Similar to the teeth 42 of FIGS. 8 and 9, the square-shaped corners 46 are approximately equal or smaller in size than to the average grain size of the conductive layer 12. As a result, the corners 46 are not prone to lateral grain growth, and the greater distance between the metal line 18 and the interior region 48 of the edge 24 of the metal pad 16 essentially eliminates any possibility of a metal bridge forming between the interior region 48 and the metal line 18 as a result of lateral grain growth toward the metal line 18.

While the invention has been described in terms of preferred embodiments, it is apparent that other forms could be adopted by one skilled in the art. For example, while described in the context of metallizations for microcircuits, the teachings of this invention are applicable to other applications where fine narrowly-spaced polycrystalline structures of essentially any type of material (e.g., conductive, dielectric or semiconductive) are desired. Accordingly, the scope of the invention is to be limited only by the following claims.

What is claimed is:

1. A method comprising the steps of:
   forming a multilayer structure comprising a polycrystalline layer and at least one constraining layer on a substrate;
   patterning the multilayer structure to form a first structure and a second structure that is narrower in width than the first structure, the first structure having a patterned edge that is spaced apart from a patterned edge of the second structure; and
   subjecting the multilayer structure to thermal processing sufficient to cause grain growth in the polycrystalline layer of the first structure;
   wherein the patterning step produces means for preventing contact between the patterned edge of the second structure and grains that have grown laterally from the polycrystalline layer along the patterned edge of the first structure toward the second structure, the means being at least one chosen from the group consisting of:
      patterning the multilayer structure to form a dummy structure between and spaced apart from the first structure and the second structure, the dummy structure being spaced apart from the first structure and the second structure a distance less than or equal to an average grain size of the polycrystalline layer except for grains that have grown laterally from the polycrystalline layer of the first structure and contact the dummy structure as a result of the thermal processing;
      patterning holes near the patterned edge of the first structure;
      forming the patterned edge of the first structure to have teeth that project toward the second structure and are closer to the second structure than remaining portions of the patterned edge that are between the teeth; and
      forming the patterned edge of the first structure to be stepped so that the first structure has corner regions at opposite ends of the patterned edge that are closer to the second structure than a remaining portion of the patterned edge between the corners.

2. A method according to claim 1, wherein the thermal processing comprises annealing the first structure so that grains grow laterally from the polycrystalline layer of the first structure and contact the dummy structure.

3. A method according to claim 1, wherein the preventing means comprises the holes, the holes being aligned in a row along the patterned edge and being spaced apart from the patterned edge and from each other a distance less than or equal to an average grain size of the polycrystalline layer.

4. A method according to claim 3, wherein the first structure is spaced apart from the second structure a distance less than or equal to an average grain size of the polycrystalline layer.

5. A method according to claim 3, wherein the thermal processing comprises annealing the first structure so that grains grow laterally from the polycrystalline layer of the first structure toward the second structure but do not contact the second structure.

6. A method according to claim 1, wherein the preventing means comprises the teeth, the teeth being aligned in a row along the patterned edge and the size of each tooth being less than or equal to an average grain size of the polycrystalline layer.

7. A method according to claim 6, wherein the teeth are spaced apart from the second structure a distance less than or equal to an average grain size of the polycrystalline layer.

8. A method according to claim 6, wherein the thermal processing comprises annealing the first structure so that grains grow laterally from the polycrystalline layer of the first structure toward the second structure but do not contact the second structure.

9. A method according to claim 1, wherein the preventing means comprises the stepped patterned edge of the first structure, the size of each corner region being less than or equal to an average grain size of the polycrystalline layer.

10. A method according to claim 9, wherein the corner regions of the patterned edge are spaced apart from the second structure a distance less than or equal to an average grain size of the polycrystalline layer.

11. A method according to claim 9, wherein the thermal processing comprises annealing the first structure so that grains grow laterally from the polycrystalline layer of the first structure toward the second structure but do not contact the second structure.

12. A method according to claim 1, wherein the multilayer structure is metallization of a microcircuit, the first and second structures are electrically insulated from each other, and the method prevents electrical shorting between the first and second structures.

13. A method according to claim 12, wherein the polycrystalline layer is an electrically-conductive layer and the constraining layer is a diffusion barrier layer.

14. A method according to claim 13, further comprising the step of heating the first structure so as to cause lateral grain growth of the electrically-conductive layer thereof toward the second structure.

15. A method according to claim 13, wherein the electrically-conductive layer is an aluminum-copper composition.

16. A method according to claim 13, wherein the diffusion barrier layer is formed of one or more materials chosen from the group consisting of titanium and titanium nitride.

17. A method according to claim 12, wherein the multilayer structure is formed to have a thickness of up to 0.25 micrometer.

18. A method according to claim 12, wherein the thermal processing comprises annealing the first structure so that grains grow laterally from the polycrystalline layer of the first structure toward the second structure but do not contact the second structure.

19. A method according to claim 1, wherein the first structure is spaced apart from the second structure a distance less than or equal to an average grain size of the polycrystalline layer.

20. A multilayer structure comprising:
    a first structure and a second structure on a substrate, each of the first and second structures comprising a polycrystalline layer and at least one constraining layer, the first structure having a patterned edge that is spaced apart from a patterned edge of the second structure; and
    means for preventing contact between the patterned edge of the second structure and grains that have grown laterally from the patterned edge of the first structure toward the second structure, the means being at least one chosen from the group consisting of:
      a dummy structure between and spaced apart from the first structure and the second structure except for grains that have grown laterally from the first structure and contact the dummy structure, the dummy structure otherwise being spaced apart from the first structure and the second structure a distance less than or equal to an average grain size of the polycrystalline layers;
      holes near the patterned edge of the first structure;
      teeth along the patterned edge of the first structure, the teeth projecting toward the second structure and being closer to the second structure than remaining portions of the patterned edge that are between the teeth; and
      steps along the patterned edge of the first structure so that the first structure has corner regions at opposite ends of the patterned edge that are closer to the second structure than a remaining portion of the patterned edge between the corner regions.

21. A multilayer structure according to claim 20, wherein the preventing means comprises the holes, the holes being aligned in a row along the patterned edge and spaced apart from the patterned edge and from each other a distance less than or equal to the average grain size of the polycrystalline layers.

22. A multilayer structure according to claim 21, wherein the first structure is spaced apart from the second structure a distance less than or equal to an average grain size of the polycrystalline layers.

23. A multilayer structure according to claim 21, further comprising grains grown laterally from the first structure toward the second structure but not contacting the second structure.

24. A multilayer structure according to claim 20, wherein the preventing means comprises the teeth, the teeth being aligned in a row along the patterned edge and the size of each tooth being approximately equal to an average grain size of the polycrystalline layers.

25. A multilayer structure according to claim 24, wherein the teeth are spaced apart from the second structure a distance less than or equal to an average grain size of the polycrystalline layers.

26. A multilayer structure according to claim 24, further comprising grains grown laterally from the first structure toward the second structure but not contacting the second structure.

27. A multilayer structure according to claim 20, wherein the preventing means comprises the stepped patterned edge of the first structure, the size of each corner region being less than or equal to an average grain size of the polycrystalline layers.

28. A multilayer structure according to claim 27, wherein the corner regions of the patterned edge are spaced apart from the second structure a distance less than or equal to an average grain size of the polycrystalline layers.

29. A multilayer structure according to claim 27, further comprising grains grown laterally from the first structure toward the second structure but not contacting the second structure.

30. A multilayer structure according to claim 20, wherein the multilayer structure is metallization of a microcircuit, the first and second structures are electrically insulated from each other, and the preventing means prevents electrical shorting between the first and second structures.

31. A multilayer structure according to claim 30, wherein the polycrystalline layer is an electrically-conductive layer and the constraining layer is a diffusion barrier layer.

32. A multilayer structure according to claim 31, further comprising grains grown laterally from the electrically-conductive layer of the first structure toward the second structure.

33. A multilayer structure according to claim 31, wherein the electrically-conductive layer is an aluminum-copper composition.

34. A multilayer structure according to claim 31, wherein the diffusion barrier layer is formed of one or more materials chosen from the group consisting of titanium and titanium nitride.

35. A multilayer structure according to claim 30, wherein the first and second structures have thicknesses of up to 0.25 micrometer.

36. A multilayer structure according to claim 30, further comprising grains grown laterally from the polycrystalline layer of the first structure toward the second structure but not contacting the second structure.

37. A multilayer structure according to claim 30, wherein the first structure is spaced apart from the second structure a distance less than or equal to an average grain size of the polycrystalline layers.

38. Metallization of a microcircuit, the metallization comprising:

a first structure and a second structure on a substrate, each of the first and second structures comprising an electrically-conductive polycrystalline layer and at least one constraining layer, the first structure having a patterned edge that is spaced apart from a patterned edge of the second structure, the polycrystalline layers of the first and second structures being characterized by grains with substantially equal average grain sizes; and means for preventing contact between the patterned edge of the second structure and grains that have grown laterally from the patterned edge of the first structure toward the second structure, the means being at least one chosen from the group consisting of:

a dummy structure between and spaced apart from the first structure and the second structure, the dummy structure comprising an electrically-conductive polycrystalline layer and at least one constraining layer, the polycrystalline layer of the dummy structure being characterized by grains with an average grain size that is substantially equal to the average grain sizes of the polycrystalline layers of the first and second structures, the dummy structure having two patterned edges that are spaced apart from the patterned edges of the first and second structures a distance less than or equal to the average grain sizes of the first, second and dummy structures except for grains that have grown laterally from the first structure and contact the dummy structure;

holes near the patterned edge of the first structure, the holes being spaced apart from each other and from the patterned edge of the first structure a distance less than or equal to the average grain sizes of the polycrystalline layers of the first and second structures;

teeth along the patterned edge of the first structure, the teeth projecting toward the second structure and being closer to the second structure than remaining portions of the patterned edge that are between the teeth, the size of each tooth being approximately equal to the average grain sizes of the polycrystalline layers, each tooth being spaced apart from the second structure a distance less than or equal to the average grain sizes of the polycrystalline layers; and steps along the patterned edge of the first structure so that the first structure has corner regions at opposite ends of the patterned edge that are closer to the second structure than a remaining portion of the patterned edge between the corner regions, the size of each corner region being less than or equal to the average grain sizes of the polycrystalline layers, and each corner region being spaced apart from the second structure a distance less than or equal to the average grain sizes of the polycrystalline layers.

* * * * *